(12) United States Patent
Yamamoto et al.

(10) Patent No.: US 8,723,054 B2
(45) Date of Patent: May 13, 2014

(54) ELECTROMAGNETIC NOISE SUPPRESSION SHEET, FLAT CABLE FOR HIGH-FREQUENCY SIGNALS, FLEXIBLE PRINTED CIRCUIT BOARD, AND PROCESS FOR PRODUCING THE ELECTROMAGNETIC NOISE SUPPRESSION SHEET

(75) Inventors: Kazumi Yamamoto, Hiroshima-ken (JP); Tetsuya Kimura, Hiroshima-ken (JP)

(73) Assignee: Toda Kogyo Corporation, Otake-shi, Hiroshima-ken (JP)

( * ) Notice: Subject to any disclaimer, the term of this patent is extended or adjusted under 35 U.S.C. 154(b) by 694 days.

(21) Appl. No.: 12/594,986

(22) PCT Filed: Apr. 10, 2008

(86) PCT No.: PCT/JP2008/000939
§ 371 (c)(1),
(2), (4) Date: Mar. 1, 2010

(87) PCT Pub. No.: WO2008/126416
PCT Pub. Date: Oct. 23, 2008

(65) Prior Publication Data
US 2010/0181107 A1    Jul. 22, 2010

(30) Foreign Application Priority Data
Apr. 11, 2007 (JP) .................................. 2007-104349

(51) Int. Cl.
H05K 9/00 (2006.01)

(52) U.S. Cl.
USPC .......................................... 174/378; 361/818

(58) Field of Classification Search
CPC . H05K 9/0007; H05K 9/0081; H05K 9/0083; H05K 9/0086
USPC .......................................... 174/378; 361/818
See application file for complete search history.

(56) References Cited

U.S. PATENT DOCUMENTS

| | | | | |
|---|---|---|---|---|
| 4,602,051 A | * | 7/1986 | Nabeta et al. ................... | 523/137 |
| 4,690,778 A | * | 9/1987 | Narumiya et al. ............. | 252/506 |
| 5,539,148 A | * | 7/1996 | Konishi et al. ................. | 174/391 |
| 6,284,363 B1 | * | 9/2001 | Maeda et al. ................... | 428/328 |
| 6,521,150 B1 | * | 2/2003 | Maeda et al. ................... | 264/102 |
| 6,869,683 B2 | * | 3/2005 | Sakurai et al. ................. | 428/448 |
| 2005/0176885 A1 | * | 8/2005 | Sekiba et al. .................. | 524/863 |
| 2006/0038630 A1 | * | 2/2006 | Kawaguchi et al. ............ | 333/12 |
| 2006/0083948 A1 | * | 4/2006 | Kawaguchi et al. ........ | 428/692.1 |
| 2009/0114440 A1 | * | 5/2009 | Yamamoto et al. ........... | 174/391 |

FOREIGN PATENT DOCUMENTS

| | | |
|---|---|---|
| JP | 54-127000 | 10/1979 |
| JP | 54-127000 A | 10/1979 |
| JP | 55-36987 | 3/1980 |
| JP | 55-36987 A | 3/1980 |
| JP | 60-249392 | 12/1985 |
| JP | 10-007867 | 1/1998 |
| JP | 2000-252113 | 9/2000 |
| JP | 2002-151881 | 5/2002 |
| JP | 2002-151881 A | 5/2002 |
| JP | 2002-184916 | 6/2002 |
| JP | 2002-184916 A | 6/2002 |
| JP | 2003-92475 | 3/2003 |
| JP | 2003-092475 | 3/2003 |
| JP | 2004-319533 | 11/2004 |
| JP | 2006-032929 | 2/2006 |
| JP | 2006-245472 | 9/2006 |
| JP | 2007-129179 | 5/2007 |

OTHER PUBLICATIONS

International Search Report for PCT/JP2008/000939, mailed Jun. 17, 2008.
Extended European Search Report in EP 08 75 1555 dated Aug. 29, 2011.

* cited by examiner

*Primary Examiner* — Jeremy C Norris
*Assistant Examiner* — Nathan Milakovich
(74) *Attorney, Agent, or Firm* — Nixon & Vanderhye P.C.

(57) ABSTRACT

An electromagnetic noise suppression sheet obtained by using combination of a conductive carbon and spinel ferrite particles having a cumulative 50% volume particle diameter of 1 to 10 μm, can exhibit an excellent transmission attenuation power ratio and a reduced return loss in a near electromagnetic field, and is suitable for high-density mounting. The electromagnetic noise suppression sheet of the present invention can be produced by the process of the present invention which includes the steps of applying a coating material in which the conductive carbon and the spinel ferrite particles having a cumulative 50% volume particle diameter of 1 to 10 μm are dispersed, to form a coating film having a thickness of 10 to 100 μm after dried, and subjecting the resulting coating film to thermoforming under pressure.

6 Claims, No Drawings

ELECTROMAGNETIC NOISE SUPPRESSION SHEET, FLAT CABLE FOR HIGH-FREQUENCY SIGNALS, FLEXIBLE PRINTED CIRCUIT BOARD, AND PROCESS FOR PRODUCING THE ELECTROMAGNETIC NOISE SUPPRESSION SHEET

This application is the U.S. national phase of International Application No. PCT/JP2008/000939 filed 10 Apr. 2008, which designated the U.S. and claims priority to JP Application No. 2007-104349 filed 11 Apr. 2007, the entire contents of each of which are hereby incorporated by reference.

TECHNICAL FIELD

The present invention relates to an electromagnetic noise suppression sheet for suppressing interference of unnecessary electromagnetic radiation generated from digital electronic devices, as well as a flat cable for high-frequency signals and a flexible printed circuit board both using the electromagnetic noise suppression sheet.

BACKGROUND ART

In recent years, the progress of digital electronic devices has been noticeable. In particular, in mobile electronic devices such as typically cellular phones, digital cameras and clamshell type computers, there is an increasing demand for higher-frequency actuating signals as well as reduction in size and weight thereof. Therefore, high-density mounting of electronic parts or wiring circuit boards used in these devices is one of most important technical tasks.

With the recent progress of high-density mounting of electronic parts or wiring circuit boards in electronic devices as well as use of higher-frequency actuating signals therefor, it may be difficult to ensure a large distance between the electronic parts that generate noises and the other adjacent parts. For this reason, in order to suppress unnecessary radiation emitted from a microprocessor, LSI or a liquid crystal panel of the electronic devices, electromagnetic noise suppression sheets have been used. In the near electromagnetic filed applications as described above, absorption and reflection phenomena of electromagnetic radiation can be hardly analyzed by a transmission line theory unlike those in the conventionally known far electromagnetic field applications (in which the electromagnetic radiation is in the form of a plane wave) (refer to Osamu HASHIMOTO, "Trend of Wave Absorbers", Journal of the Institute of Electronics, Information and Communication Engineers, Vol. 86, No. 10, pp. 800-803, October, 2003). For this reason, the electromagnetic noise suppression sheets used in the near electromagnetic field applications have been often designed depending upon experiences of experts only. In recent years, as described in Patent Documents 1 and 2, electromagnetic noise suppression sheets of such a type in which flat magnetic metal particles as soft magnetic particles are blended in a resin, have been used for absorbing electromagnetic radiation in the near electromagnetic magnetic field.

Hitherto, there is described an electromagnetic interference suppressing member which comprises, as soft magnetic particles, flat Fe—Al—Si alloy particles having an average particle diameter of 10 μm in an amount of 90% by weight (58.9% by volume when calculated from a density of the alloy particles of 6.9 kg/L and a density of the resin of 1.1 kg/L with respect to the compositions 1 and 3), and which has a thickness of 1.2 mm (Patent Document 1).

As the production method, there is described such a method for producing a magnetic sheet in which after a magnetic coating material obtained by dispersing flat magnetic metal particles in a resin and a solvent is applied onto a substrate having a release layer and then dried, the resulting dried coating film is peeled off from the substrate to obtain the magnetic sheet. In Examples of the above production method, there is also described the magnetic shielding sheet having a dried film thickness of 120 μm in which sendust particles are filled at a maximum filling percentage of 80% by weight (56.0% by volume when calculated from a density of the sendust particles of 6.9 kg/L and a density of the resin of 1.1 kg/L). This indicates that the above method can realize production of a thinner magnetic sheet as compared to that described in Patent Document 1. It is considered that the thus obtained thin magnetic sheet is more suitable for high-density mounting of electronic parts or wiring circuit boards (Patent Document 2).

Patent Document 1: Japanese Patent Application Laid-Open (KOAKI) No. 7-212079

Patent Document 2: Japanese Patent Application Laid-Open (KOAKI) No. 2000-244171

DISCLOSURE OF THE INVENTION

Problem to be Solved by the Invention

With the progress of reduction in size and weight of digital electronic devices, it has been strongly required to realize higher-density mounting of electronic parts and wiring circuit boards and provide an electromagnetic noise suppression sheet which has a smaller thickness and can exhibit a more excellent electromagnetic absorption performance and a less electromagnetic reflection in a near electromagnetic field. In general, as the thickness of an electromagnetic noise suppression sheet is reduced, an electromagnetic absorption performance thereof is deteriorated. Therefore, in order to provide the electromagnetic noise suppression sheet having a reduced thickness, it is required to increase a content of soft magnetic particles in the sheet, control a conductivity of the sheet and ensure practical flexibility and strength of the sheet.

Thus, an object of the present invention is to provide an electromagnetic noise suppression sheet which is capable of suppressing electromagnetic interference of electronic devices in which electronic parts are mounted with a high density, and can exhibit the suppressing effect over a wide frequency range from a low frequency to a high frequency.

Means For Solving the Problem

According to the present invention, there is provided an electromagnetic noise suppression sheet comprising 3 to 10% by volume of a conductive carbon and 40 to 65% by volume of spinel ferrite particles having a cumulative 50% volume particle diameter of 1 to 10 μm (Invention 1).

Also, according to the present invention, there is provided an electromagnetic noise suppression sheet as described in Invention 1 wherein when subjecting the electromagnetic noise suppression sheet having a thickness of not more than 100 μm to measurements using a microstripline, a transmission attenuation power ratio thereof is not less than 10% as measured at a frequency of 500 MHz and not less than 40% as measured at a frequency of 3 GHz, and a return loss thereof is not more than −5 dB as measured in a frequency range of 100 MHz to 3 GHz (Invention 2).

Further, according to the present invention, there is provided a flat cable for high-frequency signals comprising the electromagnetic noise suppression sheet as described in Invention 1 or 2 (Invention 3).

Further, according to the present invention, there is provided a flexible printed circuit board comprising the electromagnetic noise suppression sheet as described in Invention 1 or 2 Invention 4).

In addition, according to the present invention, there is provided a process for producing an electromagnetic noise suppression sheet, comprising the steps of:

preparing a coating material in which a predetermined amount of a conductive carbon and a predetermined amount of spinel ferrite particles having a cumulative 50% volume particle diameter of 1 to 10 μm are dispersed such that contents of the conductive carbon and the spinel ferrite particles having a cumulative 50% volume particle diameter of 1 to 10 μm in the dried coating material are 3 to 10% by volume and 40 to 65% by volume, respectively;

applying the thus prepared coating material onto a substrate to form a coating film having a predetermined thickness;

drying the thus formed coating film; and subjecting the thus dried coating film to thermoforming under pressure (Invention 5).

Effect of the Invention

In accordance with the present invention, by using combination of a conductive carbon and spinel ferrite particles having a cumulative 50% volume particle diameter of 1 to 10 μm, it is possible to produce an electromagnetic noise suppression sheet which can exhibit an excellent electromagnetic absorption and a return loss in a near electromagnetic field, and is suitable for high-density mounting. The electromagnetic noise suppression sheet of the present invention can be produced by the process of the present invention which includes the steps of applying a coating material in which the conductive carbon and the spinel ferrite particles having a cumulative 50% volume particle diameter of 1 to 10 μm are dispersed, to form a coating film having a thickness of 10 to 100 μm after dried, and subjecting the resulting coating film to thermoforming under pressure.

PREFERRED EMBODIMENT FOR CARRYING OUT THE INVENTION

Examples of the spinel ferrite particles used in the present invention include Ni—Zn—Cu-based spinel ferrite particles and Mn—Zn-based spinel ferrite particles. The Ni—Zn—Cu-based spinel ferrite particles have a composition comprising 40 to 50 mol % of $Fe_2O_3$, 10 to 30 mol % of NiO, 10 to 30 mol % of ZnO and 0 to 20 mol % of CuO, and the Mn—Zn-based spinel ferrite particles have a composition comprising 45 to 55 mol % of $Fe_2O_3$, 25 to 35 mol % of MnO and 10 to 15 mol % of ZnO. These spinal ferrite particles may be produced by uniformly mixing the respective oxide particles with each other, calcining the resulting mixture at a temperature of 750 to 1200° C. and then pulverizing the obtained calcined product.

The spinel ferrite particles used in the present invention have a cumulative 50% volume particle diameter of 1 to 10 μm and preferably 2 to 8 μm. When the cumulative 50% volume particle diameter is less than 1 μm, the resulting spinel ferrite particles tends to be hardly packed with a high density. When the cumulative 50% volume particle diameter is more than 10 μm, the sheet obtained by using the spinel ferrite particles which has a thickness as small as not more than 50 μm tends to hardly exhibit a sufficient surface smoothness.

Examples of the conductive carbon usable in the present invention include granular conductive carbon black and fibrous carbon obtained by processing carbon fibers.

The granular conductive carbon black has a particle diameter of preferably 20 to 60 nm and more preferably 30 to 40 nm and a BET specific surface area of preferably 30 to 1300 $m^2/g$ and more preferably 700 to 1300 $m^2/g$. In particular, the highly-conductive carbon black having a hollow shell structure is preferred.

As the fibrous carbon obtained by processing carbon fibers, there may be suitably used cut fibers having a fiber length of 3 to 24 mm or milled fibers having a fiber length of 30 to 150 μm. When observing the surface of the processed electromagnetic noise suppression sheet in which the fibrous carbon is incorporated, using a scanning electron microscope, the fiber length of the fibrous carbon is preferably about 10 μm to about 10 mm and more preferably about 30 μm to about 3 mm. When the fiber length of the fibrous carbon in the sheet is less than 10 μm, the resulting sheet tends to be deteriorated in electromagnetic absorption performance when flexed. When the fiber length of the fibrous carbon in the sheet is more than 10 mm, the resulting sheet tends to suffer from fuzzing, resulting in poor handling property thereof.

Next, the electromagnetic noise suppression sheet of the present invention is described.

In the electromagnetic noise suppression sheet of the present invention which is constituted from combination of the granular conductive carbon and the spinel ferrite particles, the content of the conductive carbon in the electromagnetic noise suppression sheet is 3 to 8% by volume. When the content of the conductive carbon is less than 3% by volume, the resulting sheet tends to be deteriorated in electromagnetic absorption performance. When the content of the conductive carbon is more than 8% by volume, a slurry comprising the conductive carbon tends to exhibit a high viscosity and, therefore, a poor dispersibility, so that the resulting sheet tends to hardly exhibit a sufficient electromagnetic absorption performance. Further, the sheet after dried tends to be deteriorated in flexing property, resulting in inconvenience upon use.

When using a mixture of the granular conductive carbon and the fibrous carbon as the conductive carbon to be blended in the electromagnetic noise suppression sheet of the present invention, the total carbon content in the sheet can be increased up to 10% by volume since the carbon can be enhanced in dispersibility. For this reason, as compared to the case where the granular conductive carbon is used solely, the resulting sheet can exhibit more excellent flexing property and electromagnetic absorption performance, can be improved in moldability and, therefore can be readily processed. The mixing ratio (volume ratio) of the granular conductive carbon to the fibrous carbon (granular conductive carbon: fibrous carbon) in the sheet is preferably 1:0.1 to 1 and more preferably 1:0.4 to 1.

The electromagnetic noise suppression sheet of the present invention is produced by the process comprising the steps of preparing a coating material in which a predetermined amount of a conductive carbon and a predetermined amount of spinel ferrite particles having a cumulative 50% volume particle diameter of to 10 μm are dispersed such that contents of the conductive carbon and the spinel ferrite particles having a cumulative 50% volume particle diameter of 1 to 10 μm in the dried coating material are 3 to 10% by volume and 40 to 65% by volume, respectively; applying the thus prepared coating material onto a substrate to form a coating film having a predetermined thickness; drying the thus formed coating film; and subjecting the thus dried coating film to thermoforming under pressure.

When the total amount of the conductive carbon and the spinel ferrite particles filled in the sheet is less than 43% by volume, the resulting sheet tends to have a low transmission attenuation power ratio. When the total amount of the conductive carbon and the spinel ferrite particles filled in the sheet is more than 75% by volume, the resulting sheet tends to exhibit a large return loss, thereby causing undesirable decrease in strength and flexibility of the sheet. When the granular conductive carbon only is filled with a high filling percentage, the conductive carbon tends to be hardly dispersed in the slurry, resulting in increase in viscosity of the slurry. As a result, it may be difficult to obtain a sheet having a thickness of not more than 100 μm from the slurry. The thickness of the coating film after dried may be suitably controlled by applying the coating material with a predetermined (constant) thickness.

The thickness of the sheet may be variously adjusted depending upon the applications or use conditions thereof, and is usually not more than 100 μm and preferably not more than 50 μm. When using the sheet for high-density mounting of electronic parts, the thickness of the sheet is preferably not more than 50 μm. If the thickness of the sheet is more than 100 μm, such a thickness may be too large to apply the sheet to electronic circuits mounted with a high density. Also, the thickness of the sheet is usually not less than 10 μm and preferably not less than 30 μm. When the thickness of the sheet is less than 10 μm, the resulting sheet tends to be insufficient in strength.

The electromagnetic noise suppression sheet of the present invention preferably comprises a resin as a binder in an amount of 15 to 30% by volume. When the amount of the resin blended in the sheet is less than 15% by volume, the resulting sheet tends to be deteriorated in flexing property. When the amount of the resin blended in the sheet is more than 30% by volume, the resulting sheet tends to be deteriorated in transmission attenuation power ratio. Examples of the resin include styrene-based elastomers such as SEES (styrene-ethylene-butylene-styrene block copolymers), olefin-based elastomers, polyester-based elastomers, polyimide-based elastomers, urethane-based elastomers and silicone-based elastomers. These elastomers may be used in the form of a mixture with an acrylic resin, an epoxy resin, a polyolefin resin, etc.

The electromagnetic noise suppression sheet of the present invention preferably comprises a flame retardant in an amount of 5 to 20% by volume. When the content of the flame retardant in the sheet is less than 5% by volume, the resulting sheet may fail to exhibit a sufficient flame-retarding effect. When the content of the flame retardant in the sheet is more than 20% by volume, the resulting sheet tends to be deteriorated in transmission attenuation power ratio. As the flame retardant, there may be suitably used melamine polyphosphate, magnesium hydroxide, hydrotalcite, etc. Among these flame retardants, preferred are magnesium hydroxide and melamine polyphosphate.

The electromagnetic noise suppression sheet of the present invention which has a thickness of not more than 100 μm preferably exhibits a transmission attenuation power ratio of not less than 10% as measured at a frequency of 0.5 GHz and not less than 40% as measured at a frequency of 3 GHz. When the transmission attenuation power ratio is less than these values, the resulting electromagnetic noise suppression sheet tends to be insufficient in transmission attenuation power ratio performance.

The electromagnetic noise suppression sheet of the present invention which has a thickness of not more than 100 μm preferably exhibits a return loss of not less than −5 dB as measured in a frequency range of 0.1 to 3 GHz. When the return loss is more than −5 dB, the resulting sheet tends to exhibit an excessively large return loss.

Next, the flat cable for high-frequency signals and the flexible printed circuit board according to the present invention are described.

The flat cable for high-frequency signals and the flexible printed circuit board according to the present invention in which the electromagnetic noise suppression sheet of the present invention is used, serve for reducing the size of the board and decreasing noise-emitting sources of the wiring circuit board itself. With the above construction, the higher-density mounting of electronic circuits can be achieved, thereby enabling reduction in driving voltage and increase in electric current flowing therethrough, and providing the board having a good noise resistance.

The flat cable for high-frequency signals and the flexible printed circuit board according to the present invention are respectively produced, for example, by the method of applying the above-prepared coating material onto a substrate for the flat cable for high-frequency signals and the flexible printed circuit board, drying the resulting coating film, and then subjecting the coating film to thermoforming under pressure.

The process for producing an electromagnetic noise suppression sheet according to the present invention comprises the steps of preparing a coating material in which a predetermined amount of a conductive carbon and a predetermined amount of spinel ferrite particles having a cumulative 50% volume particle diameter of 1 to 10 μm are dispersed such that contents of the conductive carbon and the spinel ferrite particles having a cumulative 50% volume particle diameter of 1 to 10 μm in the dried coating material are 3 to 10% by volume and 40 to 65% by volume, respectively; applying the thus prepared coating material onto a substrate to form a coating film having a predetermined thickness; drying the thus formed coating film; and subjecting the thus dried coating film to thermoforming under pressure. By adjusting the thickness of the applied coating material to a predetermined thickness, it is possible to control the thickness of the sheet obtained after drying to a suitable thickness. The coating material may be applied directly onto a substrate constituting a final product such as a flat cable for high-frequency signals and a flexible printed circuit board to form a coating film thereon. Alternatively, the coating material may be applied onto a substrate such as a carrier film produced from PET, etc., to form a coating film thereon. In the latter case, the dried coating film may be peeled off from the substrate after subjected to thermoforming under pressure, and can be used as an electromagnetic noise suppression sheet. The use of such a coating material is preferred because the respective components can be filled with a high filling percentage and can be uniformly dispersed in the sheet.

EXAMPLES

The methods for measuring various properties in the following Examples, etc., are as follows.

Density of Particles:

The density of the particles was measured by the following method. That is, using a density meter "MULTIVOLUME DENSIMETER 1305 Model" manufactured by Micro-Melitecs Co., Ltd., 28 g (W) of the particles were charged in a metering cell thereof, and a helium gas pressure sample volume (V) of the particles was measured. The density of the particles was calculated from the following formula:

Density=$W/V$(g/cm$^3$).

Measurement of Electromagnetic Absorption (Transmission Attenuation Power Ratio) and Return Loss:

Measured using a substrate provided with a microstripline which had a length of 100 mm, a width of 2.3 mm and a thickness of 35 μm and whose impedance was controlled to 50•. The thus prepared sheet was cut into a test specimen having a width of 40 mm and a length of 50 mm.

The microstripline was connected to a network analyzer "8720D" manufactured by Hewlett Packard Corp., to measure a S parameter of the microstripline. The sheet was fitted to the microstripline such that they are aligned in length directions with each other and centers of both the elements are consistent with each other. A 10 mm-thick foamed polystyrene plate having the same size as that of the sheet and an expansion ratio of 20 to 30 times was overlapped on the sheet, and further a weight of 300 g was loaded on the polystyrene plate to measure a S parameter of the microstripline under such a condition. Transmission attenuation power ratio (%) and return loss (dB) of the test specimen were calculated from the thus measured S parameter according to the following formula:

Transmission attenuation power ratio=$(1-|S_{11}|^2-|S_{21}|^2)/1 \times 1.00$ (%)

Return loss=$20 \log|S_{11}|$(dB).

Cumulative 50% Volume Particle Diameter:

The cumulative 50% volume particle diameter of spinel ferrite particles was measured by a wet method using a "Microtrack MT3300" manufactured by Nikkiso Co., Ltd. Five grams of the ferrite particles were added to 100 mL of an aqueous solution comprising 0.2% of hexametaphosphoric acid as a dispersant and 0.05% of a nonionic surfactant "Triton X-100" produced by Dow Chemical Company as a surfactant. The resulting mixture was dispersed for 300 sec using an ultrasonic homogenizer "Model 300W" manufactured by Nikkiso Co., Ltd., and than a volume distribution thereof was measured under the conditions including a measuring time of 30 sec, a measuring range of size of 0.021 to 1408 μm, a refractive index of solvent of 1.33 and a refractive index of particles of 2.94 as well as under the condition that the particles to be measured had a non-spherical shape.

Example 1

Spinel ferrite ("BSN714" produced by Toda Kogyo Corp.; cumulative 50% volume particle diameter: 5.1 μm; density: 5.1 g/cm³), a styrene-based elastomer, a conductive carbon ("KETJENBLACK EC" produced by Ketjenblack International Co., Ltd.; density: 1.6 g/cm³), a conductive carbon ("TORAYKA CUT FIBER 700-006C" produced by Toray Co., Ltd.; density: 1.6 g/cm³), melamine polyphosphate ("MPP-A" produced by Sanwa Chemical Co., Ltd.; density: 1.8 g/cm³) as a flame retardant and magnesium hydroxide ("KISMA 5A" produced by Kyowa Chemical Industry Co., Ltd.; density: 2.4 g/cm³) were weighed in amounts of 57% by volume, 21% by volume, 4% by volume, 3% by volume, 8% by volume and 8% by volume, respectively, in terms of a volume percentage after removal of a solvent from the respective components, and added to and mixed in a solution prepared by dissolving 20% by weight of a styrene-based elastomer (density: 0.9 g/cm³) in cyclohexanone ("TF-4200E" produced by Hitachi Kasei Kogyo Co., Ltd.). The resulting mixture was stirred using a "Power Homogenizer" manufactured by SMT Corp., at a rotating speed of 15000 rpm for 60 min, thereby obtaining a slurry. In this case, ethyl cyclohexanone having the same volume as that of the elastomer solution was added to the slurry to control a viscosity of the slurry. The resulting slurry was subjected to vacuum defoaming treatment, and then applied onto a carrier film using a doctor blade, followed by drying the applied slurry to remove the solvent therefrom, thereby obtaining a sheet having a thickness of 80 μm. The thus obtained sheet was molded at a temperature of 130° C. under a pressure of 90 MPa for a pressing time of 5 min, thereby obtaining a molded sheet having a thickness of 50 μm. Thereafter, the carrier film was peeled off from the resulting molded sheet.

The thus obtained sheet had a smooth surface and was excellent in flexing property. The sheet was fitted to a microstripline having a length of 100 mm, a width of 2.3 mm, a thickness of 35 μm and an impedance of 50• which was connected to a network analyzer to measure a S parameter of the microstripline. As a result of calculating a transmission attenuation power ratio and return loss of the sheet from the thus measured S parameter, it was confirmed that the transmission attenuation power ratio was 18% as measured at a frequency of 500 MHz and 76% as measured at a frequency of 3 GHz, whereas the return loss was −10 dB as measured at a frequency of 500 MHz and not more than −10 dB as measured in a frequency range of 100 MHz to 3 GHz. Therefore, it was confirmed that the resulting sheet exhibited a high transmission attenuation power ratio and a low return loss as well as an excellent balance therebetween over a wide frequency range.

Example 2

The same procedure as defined in Example 1 was conducted except that the formulated composition was changed, thereby obtaining a sheet comprising 2% by volume of a fibrous conductive carbon ("TORAYKA CUT FIBER 700-006C" produced by Foray Co., Ltd.; density: 1.6 g/cm³), 3% by volume of a conductive carbon ("KETJENBLACK EC" produced by Ketjenblack International Co., Ltd.; density: 1.6 g/cm³), 57% by volume of spinel ferrite particles ("BSF547" produced by Toda Kogyo Corp.; cumulative 50% volume particle diameter: 3.2 μm; density: 5.1 g/cm³), 8% by volume of melamine polyphosphate ("MPP-A" produced by Sanwa Chemical Co., Ltd.; density: 1.8 g/cm³) as a flame retardant and 8% by volume of magnesium hydroxide ("KISMA 5A" produced by Kyowa Chemical Industry Co., Ltd.; density: 2.4 g/cm³) and having a thickness of 35 μm after subjected to thermoforming under pressure. As a result of evaluation of the S parameter using a microstripline, it was confirmed that the resulting sheet had a transmission attenuation power ratio of 20% as measured at a frequency of 500 MHz and 83% as measured at a frequency of 3 GHz, and a return loss of not more than −9 dB as measured in a frequency range of 100 MHz to 3 GHz. Therefore, it was confirmed that the resulting sheet exhibited a high transmission attenuation power ratio and a low return loss as well as an excellent balance therebetween over a wide frequency range.

Example 3

The same procedure as defined in Example 1 was conducted except that the formulated composition was changed, thereby obtaining a sheet comprising 4% by volume of a fibrous conductive carbon ("CUT FIBER TORAYKA 700-006C" produced by Toray Co., Ltd.; density: 1.5 g/cm³), 3% by volume of a conductive carbon ("KETJENBLACK EC" produced by Ketjenblack International Co., Ltd.; density: 1.6 g/cm³), 57% by volume of spinel ferrite particles ("BSN714" produced by Toda Kogyo Corp.; cumulative 50% volume particle diameter: 5.1 μm; density: 5.1 g/cm³), 8% by volume of melamine polyphosphate ("MPP-A" produced by Sanwa Chemical Co., Ltd.; density: 1.8 g/cm$^3$) as a flame retardant and 8% by volume of magnesium hydroxide ("KISMA 5A" produced by Kyowa Chemical Industry Co., Ltd.; density: 2.4 g/cm$^3$) and having a thickness of 50 μm after subjected to thermoforming under pressure. As a result of evaluation of the S parameter using a microstripline, it was confirmed that the resulting sheet had a transmission attenuation power ratio of 10% as measured at a frequency of 500 MHz and 70% as measured at a frequency of 3 GHz, and a return loss of not more than −11 dB as measured in a frequency range of 100 MHz to 3 GHz. Therefore, it was confirmed that the resulting sheet exhibited a high transmission attenuation power ratio and a low return loss as well as an excellent balance therebetween over a wide frequency range.

Example 4

The same procedure as defined in Example 1 was conducted except that the formulated composition was changed, thereby obtaining a sheet comprising the respective components in the proportions as shown in Table 1 and having a thickness as shown in Table 2. As a result of measuring a transmission attenuation power ratio and a return loss of the resulting sheet from the S parameter measured using a microstripline, was confirmed that the sheet had a transmission attenuation power ratio of not less than 13% as measured at a frequency of 500 MHz and not less than 73% as measured at a frequency of 3 GHz, and a return loss of not more than −9 dB as measured in a whole frequency range of 100 MHz to 3 GHz. Therefore, it was confirmed that the resulting sheet exhibited a high transmission attenuation power ratio and a low return loss as well as an excellent balance therebetween.

Example 5

The same procedure as defined in Example 1 was conducted except that the formulated composition was changed, thereby obtaining a sheet comprising the respective components in the proportions as shown in Table 1 and having a thickness as shown in Table 2. As a result of measuring a transmission attenuation power ratio and a return loss of the resulting sheet from the S parameter measured using a microstripline, it was confirmed that the sheet had a transmission attenuation power ratio of 11% as measured at a frequency of 500 MHz and 42% as measured at a frequency of 3 GHz, and a return loss of not more than −13 dB as measured in a whole frequency range of 100 MHz to 3 GHz. Therefore, it was confirmed that the resulting sheet exhibited a high transmission attenuation power ratio and a low return loss as well as an excellent balance therebetween over a wide frequency range.

Comparative Example 1

The same procedure as defined in Example 1 was conducted except that the formulated composition was changed, thereby obtaining a sheet comprising 47% by volume of flat metal particles having a weight ratio of iron:aluminum:silicon of 85:6:9, an aspect ratio of 15 to 20, a density of 6.9 g/cm$^3$ and an average particle diameter of 50 μm, and having a thickness 100 μm after subjected to thermoforming under pressure. As a result, it was confirmed that the resulting sheet had a transmission attenuation power ratio of 10% as measured at a frequency of 500 MHz and 43% as measured at a frequency of 3 GHz, and a return loss not more than −10 dB as measured in a frequency range of 100 MHz to 3 GHz. The resulting sheet exhibited an excellent balance between transmission attenuation power ratio and return loss. However, when considering that the thickness of the sheet was as large as 100 μm, the sheet was considerably deteriorated in absorption performance as compared to that obtained in Example 1.

Comparative Example 2

The same procedure as defined in Comparative Example 1 was conducted except that the thickness of the resulting sheet was controlled to 500 μm. The results are shown in Table 1. The resulting sheet exhibited good transmission attenuation power ratio and return loss properties, but were unsuitable for high-density mounting because the sheet had a thickness as large as 500 μm.

Comparative Examples 3 To 10

The same procedure as defined in Example 1 was conducted except that the formulated composition was changed as shown in Table 1, thereby obtaining sheets each having a thickness as shown in Table 2. Although the sheets obtained in Comparative Examples 3 to 9 all exhibited a return loss of not more than −20 dB, they had a transmission attenuation power ratio of less than 10% as measured at a frequency of 500 MHz and less than 26% as measured at a frequency of 3 GHz. Therefore, in these Comparative Examples, there were obtained only electromagnetic noise suppression sheet having a less transmission attenuation power ratio.

In addition, in Comparative Example 9, it has been attempted to produce a sheet having the formulated composition as shown in Table 1 by the same method as defined in Example 1. However, the fibers were not well dispersed in the coating material, thereby failing to produce a sheet. In Comparative Example 10, the obtained sheet exhibited a good transmission attenuation power ratio of 33% as measured at a frequency of 500 MHz and 90% as measured at a frequency of 3 GHz, but the peak of return loss thereof was as large as −4 dB. Therefore, the resulting sheet had undesirable properties for signal transmission.

Comparative Examples 11 And 12

The same procedures as defined in Example 3 (Comparative Example 11) and Example 4 (Comparative Example 12) were conducted except that the spinel ferrite particles as shown in Table 1 were used, thereby obtaining sheets each having the formulated composition as shown in Table 1 in which the amount of the conductive carbon filled was reduced. Although the sheets obtained in Comparative Examples 11 and 12 both exhibited a return loss of not more than −12 dB, they had a transmission attenuation power ratio as low as 6% and 7%, respectively, as measured at a frequency of 500 MHz, and 28% and 32%, respectively, as measured at a frequency of 3 GHz.

Examples 6 And 7 And Comparative Examples 13 And 14

The sheets each having the formulated composition as shown in Table 1 and the thickness as shown in Table 2 were produced by the same method as defined in Example 1.

The formulated compositions used in the respective Examples and Comparative Examples are collectively shown in Table 1.

TABLE 1

| | Conductive carbon | | Carbonyl iron | | Spinel ferrite particles | | flat | Granular | Flame retardant | | Resin |
|---|---|---|---|---|---|---|---|---|---|---|---|
| | Granular | Fibrous | R1470 | S1641 | BSN714 | BSF547 | Sendust | Sendust | Melamine phosphate | Mg(OH)$_2$ | TF-4200E |
| Example 1 | 4 | 3 | — | — | 57 | — | — | — | 8 | 8 | 20 |
| Example 2 | 3 | 2 | — | — | — | 57 | — | — | 8 | 8 | 22 |
| Example 3 | 4 | 3 | — | — | 45 | — | — | — | 8 | 8 | 32 |
| Example 4 | 3 | 2 | — | — | — | 45 | — | — | 8 | 8 | 32 |
| Example 5 | 8 | — | — | — | 60 | — | — | — | 8 | 8 | 16 |
| Example 6 | 3 | 3 | — | — | 61 | — | — | — | — | — | 31 |
| Example 7 | 5 | 5 | — | — | 55 | — | — | — | 8 | 8 | 19 |
| Comparative Example 1 | — | — | — | — | — | — | 47 | — | — | — | 53 |
| Comparative Example 2 | — | — | — | — | — | — | 47 | — | — | — | 53 |
| Comparative Example 3 | — | — | 65 | — | — | — | — | — | — | — | 35 |
| Comparative Example 4 | — | 2 | — | — | 65 | — | — | — | — | — | 33 |
| Comparative Example 5 | — | 2 | — | 62 | — | — | — | — | — | — | 36 |
| Comparative Example 6 | — | 2 | 60 | — | — | — | — | — | — | — | 38 |
| Comparative Example 7 | 2 | — | — | 62 | — | — | — | — | — | — | 36 |
| Comparative Example 8 | 2 | — | — | — | — | — | — | 55 | — | — | 43 |
| Comparative Example 9 | — | 15 | 55 | — | — | — | — | — | — | — | 30 |
| Comparative Example 10 | 15 | — | 55 | — | — | — | — | — | — | — | 30 |
| Comparative Example 11 | 1 | 1 | — | — | 45 | — | — | — | 8 | 8 | 37 |
| Comparative Example 12 | 1 | 1 | — | — | — | 45 | — | — | 8 | 8 | 37 |
| Comparative Example 13 | 12 | — | — | — | 55 | — | — | — | 8 | 8 | 17 |
| Comparative Example 14 | — | 12 | — | — | 55 | — | — | — | 8 | 8 | 17 |

Properties of electromagnetic noise suppression sheets obtained in the above Examples and Comparative Examples are collectively shown in Table 2.

TABLE 2

| | Properties of sheet | | | |
|---|---|---|---|---|
| | Thickness of sheet | Transmission attenuation power ratio (%) | | Return loss: maximum value (dB) |
| | (μm) | 0.5 GHz | 3 GHz | 0.1-3 GHz |
| Example 1 | 50 | 18 | 76 | −10 |
| Example 2 | 50 | 20 | 83 | −9 |
| Example 3 | 50 | 10 | 70 | −11 |
| Example 4 | 50 | 13 | 73 | −9 |
| Example 5 | 50 | 11 | 42 | −13 |
| Example 6 | 100 | 34 | 73 | −12 |
| Example 7 | 50 | 25 | 68 | −11 |
| Comparative Example 1 | 100 | 10 | 43 | −10 |
| Comparative Example 2 | 500 | 20 | 85 | −7 |
| Comparative Example 3 | 50 | 2 | 16 | −23 |

TABLE 2-continued

| | Properties of sheet | | | |
|---|---|---|---|---|
| | Thickness of sheet | Transmission attenuation power ratio (%) | | Return loss: maximum value (dB) |
| | (μm) | 0.5 GHz | 3 GHz | 0.1-3 GHz |
| Comparative Example 4 | 50 | 4 | 18 | −23 |
| Comparative Example 5 | 50 | 4 | 19 | −24 |
| Comparative Example 6 | 50 | 4 | 26 | −20 |
| Comparative Example 7 | 50 | 6 | 30 | −14 |
| Comparative Example 8 | 50 | 5 | 26 | −20 |
| Comparative Example 9 | Not formed into sheet | Not measurable | Not measurable | Not measurable |
| Comparative Example 10 | 50 | 33 | 90 | −4.5 |
| Comparative Example 11 | 50 | 6 | 28 | −18 |
| Comparative Example 12 | 50 | 7 | 32 | −12 |
| Comparative Example 13 | 50 | 27 | 78 | −5 |
| Comparative Example 14 | Not formed into sheet | Not measurable | Not measurable | Not measurable |

The electromagnetic noise suppression sheets obtained in Examples 1 and 5 and Comparative Example 13 were subjected to bending test. In the bending test, a test specimen cut into a width of 40 mm and a length of 50 mm was subjected to measurement using a stripline to determine initial properties of transmission attenuation power ratio and return loss thereof. Thereafter, the test specimen was placed underneath a 3 mm-thick plastic plate having a chamfered edge for forming a 70° slant surface such that a short side (40 mm) of the test specimen was disposed in parallel with the slant surface-formed side of the plastic plate, and bent along the slant surface until the test specimen was brought into close contact with the edge and slant surface of the plastic plate. Under this condition, while pulling the test specimen in the direction perpendicular to the slant surface-formed side of the plastic plate and sliding the lightly pressed plastic plate in the pulling direction, the test specimen was successively bent over its entire portion as uniformly as possible. Immediately after repeating the above procedure 10 times, the bent test specimen was subjected again to measurements of transmission attenuation power ratio and return loss thereof using a stripline to determine whether or not any change in these properties occurred, more specifically, determine whether or not each of the transmission attenuation power ratio and return loss was changed by 20% or more from the respective initial values thereof.

In the electromagnetic noise suppression sheets obtained in Examples 1 and 5, the amounts of change in transmission attenuation power ratio between before and after the bending test were 9% and 13%, respectively, as measured at a frequency of 3 GHz. That is, when using the combination of the granular conductive carbon and the fibrous conductive carbon, the resulting sheets were excellent in flexing property and electromagnetic suppressing function. Whereas, in the electromagnetic noise suppression sheet obtained in Comparative Example 13, the amount of change in the property between before and after the bending test was as large as 36%.

In the foregoing, although the present invention is explained in detail by Examples, the numeral ranges as defined in the present invention are necessarily intended to involve all of the ranges using the numerals described in any optional one of the above Examples as a critical value unless departing from the scope of the present invention, and it should be construed that all of them are described in the present specification.

INDUSTRIAL APPLICABILITY

The electromagnetic noise suppression sheet of the present invention can exhibit a high transmission attenuation power ratio and a low return loss as well as an excellent balance therebetween over a wide frequency range even though it has a thickness as small as not more than 100 μm and, therefore, is suitable as an electromagnetic noise suppression sheet having an excellent transmission attenuation power ratio and a less return loss in a near electromagnetic field.

The invention claimed is:

1. A flexible electromagnetic noise suppression sheet comprising 3 to 10% by volume of a conductive carbon and 40 to 65% by volume of spinel ferrite particles having a cumulative 50% volume particle diameter of 1 to 10 μm, wherein the thickness of the electromagnetic noise suppression sheet is not more than 100 μm and wherein flexibility is determined when the electromagnetic noise suppression sheet is subjected to a bending test in which a test specimen cut into a width of 40 mm and a length of 50 mm was placed underneath a 3 mm-thick plastic plate having a chamfered edge for forming a 70° slant surface such that a short side (40 mm) of the test specimen was disposed in parallel with the slant surface-formed side of the plastic plate, and bent along the slant surface until the test specimen was brought into close contact with the edge and slant surface of the plastic plate and the test specimen maintains its flexible state and its electromagnetic noise suppression.

2. An electromagnetic noise suppression sheet according to claim 1, wherein when subjecting the electromagnetic noise suppression sheet to measurements using a microstripline, a transmission attenuation power ratio thereof is not less than 10% as measured at a frequency of 500 MHz and not less than 40% as measured at a frequency of 3 GHz, and a return loss thereof is not more than −5 dB as measured in a frequency range of 100 MHz to 3 GHz.

3. A flat cable for high-frequency signals comprising the electromagnetic noise suppression sheet as defined in claim 1.

4. A flexible printed circuit board comprising the electromagnetic noise suppression sheet as defined in claim 1.

5. An electromagnetic noise suppression sheet according to claim 1 further comprising a resin as a binder in an amount of 15 to 30% by volume and a flame retardant in an amount of 5 to 20% by volume.

6. An electromagnetic noise suppression sheet according to claim 2, wherein the return loss thereof is not more than −9 dB as measured in a frequency range of 100 MHz to 3 GHz.

* * * * *